(12) United States Patent
Rasing et al.

(10) Patent No.: US 9,773,603 B2
(45) Date of Patent: Sep. 26, 2017

(54) MAGNETIZATION REVERSAL

(71) Applicant: Radboud Universiteit Nijmegen, Nijmegen (NL)

(72) Inventors: Theodorus Henricus Maria Rasing, Nijmegen (NL); Johan Mentink, Nijmegen (NL); Andrei Kirilyuk, Nijmegen (NL); Alexey Kimel, Nijmegen (NL); Richard Francis Llewelyn Evans, Nijmegen (NL); Roy William Chantrell, Nijmegen (NL); Thomas Andrew Ostler, Nijmegen (NL); Joseph Barker, Nijmegen (NL)

(73) Assignee: RADBOUD UNIVERSITEIT NIJMEGEN, Nijmegen (NL)

( * ) Notice: Subject to any disclaimer, the term of this patent is extended or adjusted under 35 U.S.C. 154(b) by 203 days.

(21) Appl. No.: 14/312,242

(22) Filed: Jun. 23, 2014

(65) Prior Publication Data
US 2014/0368303 A1 Dec. 18, 2014

Related U.S. Application Data

(63) Continuation of application No. PCT/NL2012/050912, filed on Dec. 21, 2012.

(30) Foreign Application Priority Data

Dec. 23, 2011 (NL) ...................... 2008039

(51) Int. Cl.
*H01F 13/00* (2006.01)
*G11C 11/16* (2006.01)
*G11C 11/14* (2006.01)

(52) U.S. Cl.
CPC .............. *H01F 13/00* (2013.01); *G11C 11/14* (2013.01); *G11C 11/16* (2013.01)

(58) Field of Classification Search
None
See application file for complete search history.

(56) References Cited

U.S. PATENT DOCUMENTS

| 8,164,988 B2 * | 4/2012 | Stipe ...................... G11B 5/314 |
| | | 360/59 |
| 9,280,996 B2 * | 3/2016 | Hellwig ................... G11B 5/65 |
| 9,449,668 B2 * | 9/2016 | Kent ....................... G11C 11/16 |
| 2005/0047283 A1 * | 3/2005 | Ruigrok ................ B82Y 10/00 |
| | | 369/13.14 |

(Continued)

OTHER PUBLICATIONS

Hohlfeld, J., Stanciu, C., and Rebei, A., Appl. Phys. Let., v94, 152504, 2009.*

(Continued)

Primary Examiner — Kevin Bernatz
(74) Attorney, Agent, or Firm — Peacock Myers, P.C.; Jeffrey Myers

(57) ABSTRACT

A method of magnetization reversal, time stable ferrimagnetic material, a product and a domain comprising said material, a system for magnetization reversal, and information storage. Therein, a ferrimagnetic material is one in which magnetic moments of the atoms on different sublattices are opposed, as in antiferromagnetism; however, in ferrimagnetic materials, the opposing moments are unequal and a spontaneous magnetization remains.

7 Claims, 7 Drawing Sheets

(56) References Cited

U.S. PATENT DOCUMENTS

| | | | |
|---|---|---|---|
| 2009/0148649 A1* | 6/2009 | Shi | G11B 5/02 428/64.4 |
| 2009/0226762 A1* | 9/2009 | Hellwig | G11B 5/66 428/815 |
| 2015/0170696 A1* | 6/2015 | Hellwig | G11B 5/65 369/110.01 |

OTHER PUBLICATIONS

Hansteen, F., Kimel, A., Kirilyuk, A., and Rasing, T., Phys. Rev. Let., v95, 047402, 2005.*

Rebei, A., and Hohlfeld, J., Phys. Let. A., v372, 1915, 2008.*

Li, T., Patz, A., Mouchliadis, L., Yan, J., Lograsso, T., Perakis, I., and Wang, J., Nature Letters, v496, 69, 2013.*

Hansteen, F., Kimmel, A., Kirilyuk, A., Rasing, T., Phys. Rev. B., v73, 014421, 2006.*

Ostler, T. et al., Abstract only of Nature Communications 3, titled: "Ultrafast heating as a sufficent stimulus for magnetization reversal in a ferrimagnet", 2012.*

Stanciu, C., Hansteen, F., Kimel, A., Kirilyuk, A., Tsukamoro, A., Itoh, A., and Rasing, T., Phys. Rev. Let., v99, 047601, 2007.*

Gong, Y., Kutaylah, A., Zhang, X., Zhao, J., and Ren, T., J. App. Phys., v111, 07D505, 2012.*

Bartlet, A. F. et al., "Element-Specific Spin and Orbital Momentum Dynamics of Fe/Gd Multilayers", Applied Physics Letters vol. 90, No. 16, 2007, 162503-1-162503-3.

Koopmans, B. et al., "Explaining the Paradoxical Diversity of Ultrafast Laser-Induced Demagnetization", Nature Materials vol. 9, 2010, 259-265.

Radu, I. et al., "Supplementary Information: Transient Ferromagnetic-Like State Mediating Ultrafast Reversal of Antiferromagnetically Coupled Spins", Nature vol. 472, No. 7342, XP055033090, DOI: 10.1038/nature09901, 2011, 1-9.

Radu, I. et al., "Transient Ferromagnetic-Like State Mediating Ultrafast Reversal of Antiferromagnetically Coupled Spins", Nature vol. 472, No. 7342, XP0550322826, ISSN: 0028-0836, DOI: 10.1038/nature09901, 2011, 205-208.

Vahaplar, K., "Ultrafast Path for Optical Magnetization Reversal via a Strongly Nonequilibrium State", Physical Review Letters vol. 103, No. 11, 2009, 117201-1-117204-1.

* cited by examiner

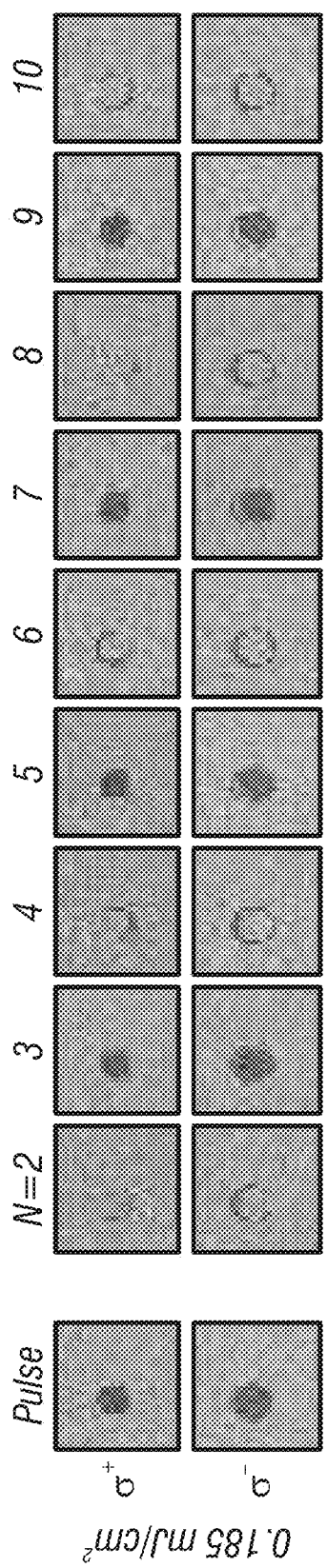
FIG. 4A
FIG. 4B
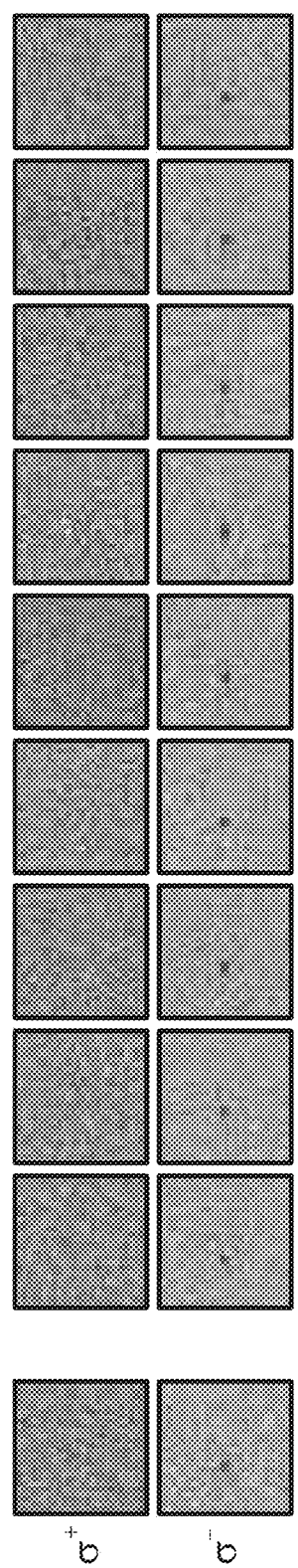
FIG. 4C
FIG. 4D

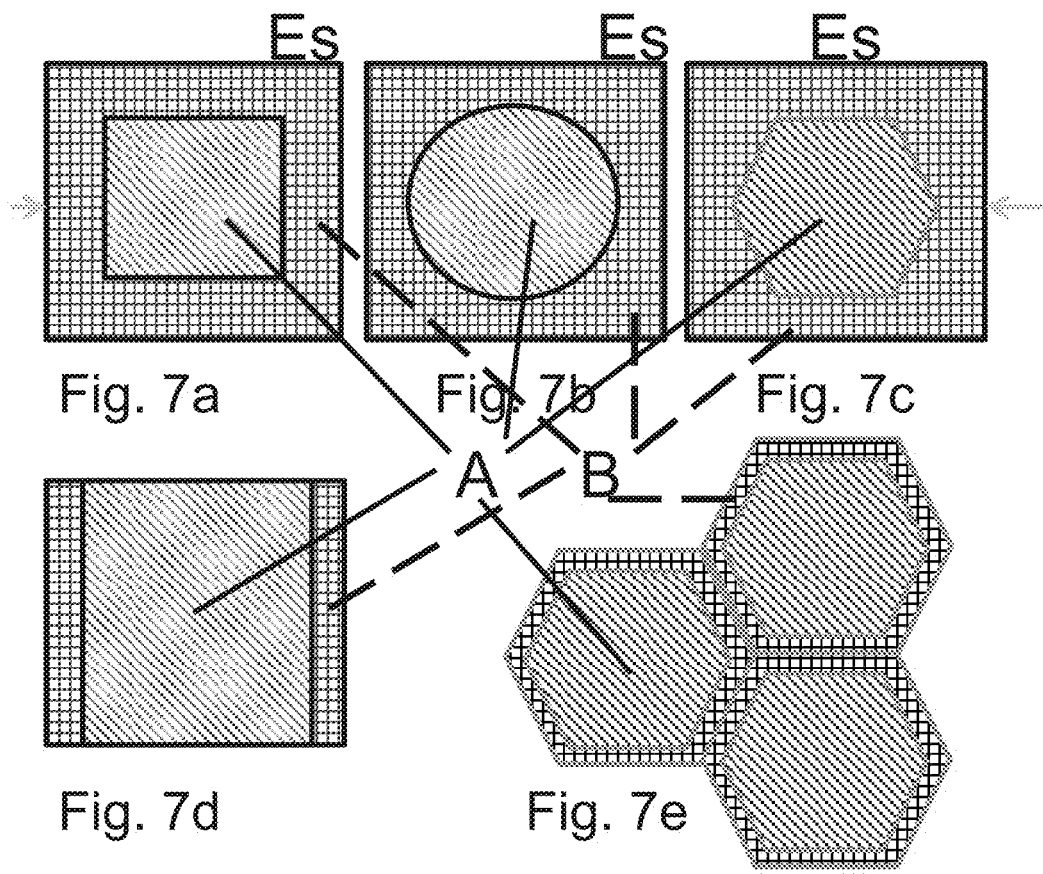

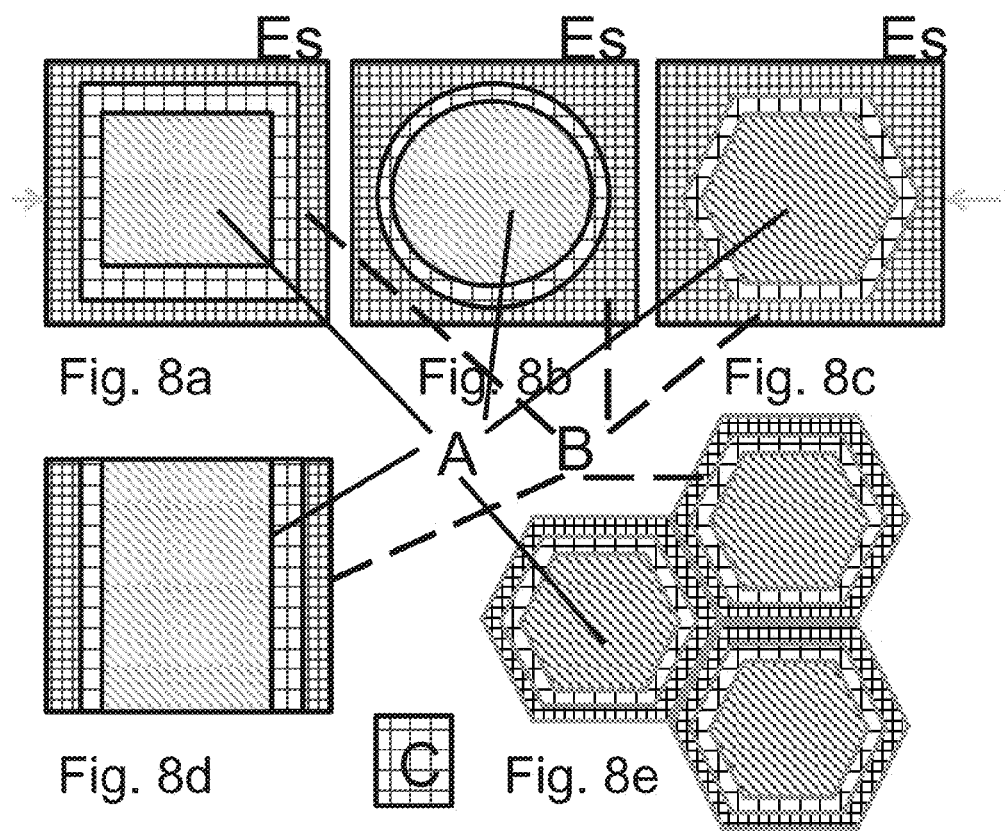

MAGNETIZATION REVERSAL

CROSS-REFERENCE TO RELATED APPLICATIONS

This application is a continuation application of Patent Cooperation Treaty Application No. PCT/NL2012/050912, entitled "Magnetization Reversal", filed on Dec. 21, 2012, which claims priority to Netherlands Patent Application No. NL2008039, filed on Dec. 23, 2011, and the specifications and claims thereof are incorporated herein by reference.

STATEMENT REGARDING FEDERALLY SPONSORED RESEARCH OR DEVELOPMENT

Not Applicable.

INCORPORATION BY REFERENCE OF MATERIAL SUBMITTED ON A COMPACT DISC

Not Applicable.

COPYRIGHTED MATERIAL

Not Applicable.

BACKGROUND OF THE INVENTION

Field of the Invention (Technical Field)

The present invention relates to the field of a method of magnetization reversal, time stable ferrimagnetic material, a product and a domain comprising said material, a system for magnetization reversal, and information storage.

Description of Related Art

In physics, a ferrimagnetic material is one in which magnetic moments of the atoms on different sublattices are opposed, as in antiferromagnetism; however, in ferrimagnetic materials, the opposing moments are unequal and a spontaneous magnetization remains. Such occurs when the sublattices consist of different materials or ions (such as $Fe^{2+}$ and $Fe^{3+}$).

Ferromagnetism is exhibited by, e.g., ferrites and magnetic garnets.

Ferrimagnetic materials are like ferromagnets in that they hold a spontaneous magnetization below their Curie temperature, and show no magnetic order (are paramagnetic) above this temperature. However, there is sometimes a temperature below the Curie temperature at which the two sublattices have equal moments, resulting in a net magnetic moment of zero; this is called the magnetization compensation point. This compensation point is observed easily in garnets and rare earth-transition metal alloys (RE-TM). Furthermore, ferrimagnets may also exhibit an angular momentum compensation point at which the angular momentum of the magnetic sublattices is compensated. This compensation point is a crucial point for achieving relatively high speed magnetization reversal. It is noted that the materials are currently not intended for use in prior art devices.

Processes of magnetization reversal triggered by a stimulus shorter than the time of thermal equilibration (100 ps) is a topic of intense research interest in both fundamental and applied magnetism.

It is generally accepted that magnetization reversal should be driven by a stimulus represented by a polar or axial vector such as magnetic field, electric current, electric field or cross-product of two electric fields.

For data storage magnetic systems should be time stable, in order not to lose data over a very long period of time, e.g., in the order of years, such as ten or more years.

Even further magnetic materials should be stable, i.e. not change spin, in relatively strong external magnetic fields applied to these materials, e.g., by chance.

Also, e.g., for data storage, a density of magnetic domains, to be addressed, should be high, e.g., in the order of $Gb/cm^2$ or higher.

It is noted that a combination of various requirements is often even more difficult to achieve, as for instance smaller domains tend to be less stable. A high density system is, e.g., therefore difficult to obtain.

On the other hand, magnetic materials should change their magnetic moment rapidly, e.g., when applying a stimulus to change the magnetic moment in order to store data. Preferably such change should take place at a speed comparable to processor speed of a modern computer, e.g., at a rate in the order of Gb/sec or larger. Present systems are typically limited to about 0.1-0.5 Gb/sec, which is regarded as relatively slow, especially in comparison to processor speed.

Even further, changes of magnetic moment should be achievable at relatively low energy consumption, in order to limit energy consumption of a computer. Such implies amongst others that heat should not be applied, or at the most at a low level.

Further, such heat assisted change of magnetic moment is not preferred in view of durability and stability of, e.g., magnetic material used, as too much heat may, e.g., deteriorate material.

Also, it should preferably be relatively easy to change a magnetic moment, such as using state of the art techniques.

Thereto new methods of magnetization reversal as well as magnetic materials need to be developed.

Radu et al. in Nature, part 472, nr. 7342, p. 205-208 (14 Apr. 2011), Radu et al. in Nature, (30 Mar. 2011), p. 1-9 and Koopmans et al. in Nature Materials, (Jan. 1, 2009) describe magnetization reversal by applying a stimulus in the presence of an external electro-magnetic field, as it was considered necessary to apply both in combination in order to achieve magnetization reversal.

Even further, as many existing materials are not suited for such magnetization reversal, and/or do not fulfill further requirements, amongst others mentioned throughout the description, a new class of magnetic materials needs to be developed.

The present invention is aimed at a method for magnetization reversal, at magnetic materials, and applications thereof, which overcome one or more of the above disadvantages, without jeopardizing functionality and advantages.

BRIEF SUMMARY OF THE INVENTION

The present invention relates to a method of magnetization reversal in a multi component magnetic system without a need for any further stimulus, such as an external electro-magnetic field, according to claim 1, to ferrimagnetic material suitable for such a method, products comprising ferrimagnetic material, a system for magnetization reversal, and use of ferrimagnetic materials.

A "high" magnetic density not only relates to small domains, such as sub-micron domains or even much smaller, such as in the order of a few atoms, the domains having magnetic properties, but also these properties should be stable in time. The latter effect is achieved in the present invention by provision of ferromagnetic materials having a high coercive field, therewith being able to withstand external magnetic fields, which ferromagnetic materials are stable over a long period of time, e.g., more than a half year. Typically these materials also have a relatively high Curie temperature, such as above 500° C., preferably above 1000° C., such as above 1300° C., i.e., also being temperature stable.

Typically properties and characteristics of the present materials are determined at about ambient temperature, using standard tests and techniques, as far as suitable, unless stated otherwise.

Note that "lattice" indicates here a magnetic subsystem that can have a crystalline lattice, and can also be amorphous.

With magnetization reversal at least one magnetic moment is reversed. Typical applications, however, reverse a whole area of magnetic moments, such as an area of 50 nm by 50 nm.

Each component in the multi component system may comprise one or more distinct layers. Also the multi lattice may comprise two or more sub lattice, optionally in a crystallographic lattice. Further, also one or more further layers, and one or more sub lattices may be present. Further, especially synthetic ferrimagnetic systems are envisaged, consisting of antiferromagnetically coupled ferromagnetic layers. Also combinations of the above are envisaged.

The anti-ferromagnetical coupling between layers can for instance be expressed by an exchange integral Jij, wherein an exchange integral Jij between spins of lattice sites i and j give rise to a magnetic order in the magnetic spin system. It is noted that magnetizations i,j are interchangeable.

It is believed that a consequence of method step a) is a non-equilibrium of the system.

It is believed that if a stimulus is much shorter than a time of thermal equilibration in a magnetic moment system, such a pulse brings a medium into a strongly non-equilibrium state, where, e.g., a conventional description of magnetic phenomena in terms of thermodynamics and adiabatic approximation is no longer valid. This is an especially interesting question in magnets consisting of several sublattices where excitation of spins on a time-scale of an exchange interaction brings the sublattices out of equilibrium with each other and thus pushes the magnetic system into another regime. It is believed that processes of ultrafast magnetization reversal in this non-adiabatically achieved strongly non-equilibrium state may be totally different from those known from classical magnetism.

Yet, although ultrafast heating may assist processes of magnetization reversal, it has been generally assumed that just a heating alone cannot result in a deterministic reversal of magnetization. Such has now been shown by the present inventors.

In the present invention a novel mechanism of magnetization reversal in a ferrimagnet is presented, which is triggered by a stimulus such as a heat pulse only. In contrast to the scenarios for magnetization reversal demonstrated previously, the present mechanism does not require any other stimuli. This novel mechanism of magnetization reversal has been demonstrated by the present inventors experimentally in ferrimagnetic continuous films and isolated micrometer-sized ferrimagnets with in-plane and out-of-plane magnetic anisotropy. It has been shown that ultrafast spin reversal of, e.g., a Rare-Earth-Transition Metal (RE-TM) ferrimagnetic alloy over its compensation point in an external magnetic field allows the initiation of the fastest spin reversal reported so far. Recent studies by inventors of such an ultrafast magnetization dynamics in GdFeCo alloy with two antiferromagnetically coupled magnetic sublattices of Gd and FeCo have discovered that the ultrafast magnetization reversal may occur via a strongly non-equilibrium transient ferromagnetic-like state, where the magnetic system stores a large amount of energy in the intra- and inter-sublattice exchange interactions. As a consequence a much weaker interaction of the spins with an external magnetic field hardly influences spin dynamics in this ultrafast regime. Surprisingly magnetization reversal can be triggered without any magnetic field and using an ultrafast heating alone.

Even further, a new sub-class of ferrimagnetic materials is provided, having superior characteristics, such as high density, such as $GB/cm^2$, high switching rate, such as TB/sec, stable under a high external magnetic field, such as of a few Tesla, suited for switching at low power consumption, such as at $mJ/cm^2$, e.g., compared to state of the art materials, which materials can be applied in systems used nowadays, such as a hard disk, without too many changes thereto. As a consequence e.g. an area of a high density 1 TB 3.5 inch disk may be reversed within a second. It is observed that many ferrimagnetic materials are known per se, but these materials do not possess the unique characteristics of the present invention. Only by carefully selecting materials the required properties are obtained.

Thereby the present invention provides a solution to one or more of the above mentioned problems.

Further scope of applicability of the present invention will be set forth in part in the detailed description to follow, taken in conjunction with the accompanying drawings, and in part will become apparent to those skilled in the art upon examination of the following, or may be learned by practice of the invention. The objects and advantages of the invention may be realized and attained by means of the instrumentalities and combinations particularly pointed out in the appended claims.

BRIEF DESCRIPTION OF THE SEVERAL VIEWS OF THE DRAWINGS

The accompanying drawings, which are incorporated into and form a part of the specification, illustrate one or more embodiments of the present invention and, together with the description, serve to explain the principles of the invention. The drawings are only for the purpose of illustrating one or more preferred embodiments of the invention and are not to be construed as limiting the invention. In the drawings:

FIGS. 4a-d show the magneto-optical images of $Gd_{24}Fe_{66.5}Co_{9.8}$ continuous film obtained after the action of a sequence of the N right-handed σ+ and left-handed σ– circularly-polarized 100 fs laser pulses.

FIGS. 7a-e show schematic cross-sections of embedded ferrimagnets.

FIGS. 8*a-e* show schematic cross-sections of embedded ferrimagnets.

DETAILED DESCRIPTION OF THE INVENTION

Figure 1:
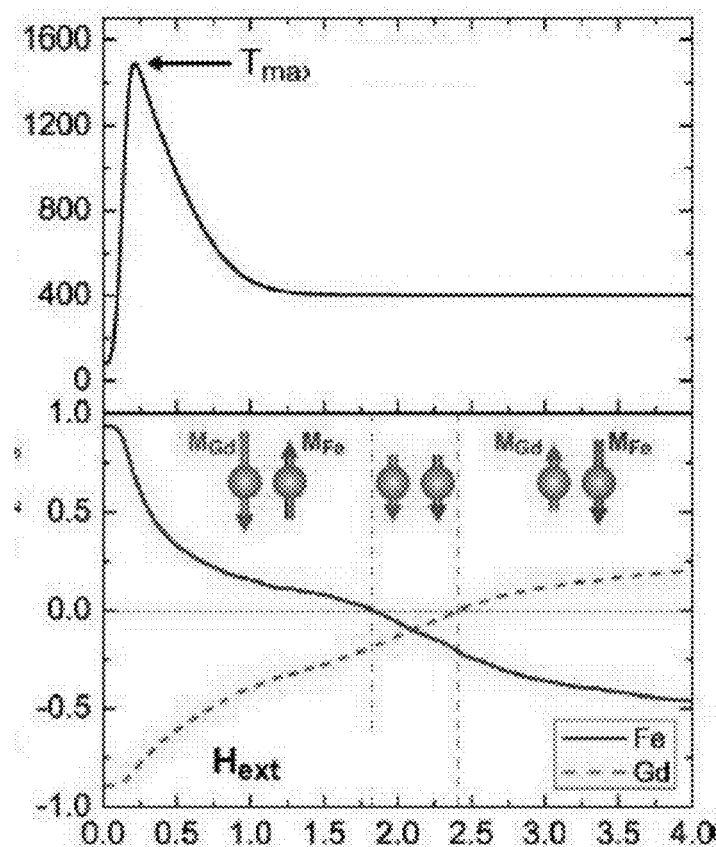
FIG. 1 shows time-resolved dynamics of the z-component of the (prior art) Fe and Gd sublattice from localized atomistic spin model.

The present invention relates in a first aspect to a method of magnetization reversal in a multi component magnetic system, according to claim 1.

Thereby it is believed that the present method takes advantage of a first magnetization reversal time domain, being of a first nature, in this case thermal, being substantially smaller than the second magnetization reversal time domain, being of a second nature, in this case exchange relaxation. It is noted that also the exchange relaxation may relate to a relatively fast process; however it is slower than the thermal process.

It is believed that during step a) electrons obtain a much higher temperature than an ambient temperature, e.g., in the order of a Curie temperature. A stimulus having energy sufficient to increase the temperature of the electrons accordingly is in principle suited.

In an example of the present method the magnetic system comprises at least two non-equivalent sub-systems, such as an anti-ferromagnet, a ferrimagnet, a synthetic ferrimagnet, or a combination thereof, preferably a ferrimagnetic system, such as a (transition metal) TM-TM system. Further examples thereof are (rare earth) RE-RE systems, TM-RE and RE-TM systems.

A synthetic ferrimagnet is, e.g., a material hand-made, being sophisticated.

It is noted that in principle the present method is applicable to a system comprising at least two non-equivalent components, such as sub-lattices, which is a first component or sub lattice with a first material, e.g. a chemical element or combination of chemical elements, and a second component or sub-lattice having similarly a second material, the first and second material being substantially different. As indicated the sub-lattices are coupled anti-ferromagnetically, e.g., a first sub-lattice having a first magnetic moment, and a second sub-lattice having a second magnetic moment, the moments being of substantially different size and of opposite sign.

The system may comprise more sub-lattices, and may comprise further lattices, such as sub-layers, such as intermediate layers.

Various examples of such materials are given below.

In an example of the present method the stimulus is applied during a period shorter than a time of thermal equilibrium, such as shorter than 100 ps, and/or wherein the stimulus is an ultrafast heat pulse, such as a heat pulse of less than 100 ps, preferably less than 10 ps, more preferably less than 1 ps, such as less than 0.25 ps, such as 100 fs.

In other words ultra-fast switching rates are obtained, e.g. in the order of TB/sec. In principle the switching times can even be in the order of 100 fs or smaller, thus allowing switching rates of more than 10 TB/sec.

In an example of the present method the heat pulse is a laser pulse, wherein the laser pulse may not be polarized, wherein the wavelength of the laser pulse is preferably from 100 nm-10000 nm, preferably from 200 nm-3000 nm, such as from 380 nm-850 nm. In an example a wavelength of about 532 nm is used. In a further example a wavelength of about 830 nm is used.

As an advantage state of the art lasers can be used, wherein the present method further allows a broad range of laser wavelengths to be applied. Even further, laser wavelength and type of multi component magnetic system can be optimized, e.g., in view of each other.

In an example of the present method an energy density of the stimulus is from 0.05-5 $mJ/cm^2$, preferably from 0.2-3 $mJ/cm^2$, more preferably from 0.5-2.5 $mJ/cm^2$, even more preferably from 1-2 $mJ/cm^2$. As mentioned above, in optimized conditions an even smaller stimulus could be enough.

If a heat pulse is used as a stimulus the energy density per area is quite high. However, it should be noted that the stimulus is applied in an extremely short time frame, e.g., ps, which is a factor 10-9 shorter than e.g. electrico-magnetical switching times. As a consequence the energy used per area is much smaller than that of a state of the art hard disk, typically an order of magnitude smaller. Albeit a hard disk does not consume a relative large amount of power, e.g., compared to a computer, any reduction in consumption can be considered as a beneficial attribute.

In an example the present magnetization reversal is established in an area of the magnetic system having a planar geometrical cross-section, the area having a (relative) longer (crystallographic) axis. The cross-section is in the present application characterized by a longer axis thereof. Such as in an area having a cross-section of less than 1 µm, preferably having a cross-section of less than 250 nm, more preferably having a cross-section of less than 100 nm, even more preferably less than 50 nm, most preferably less than 25 nm, such as less than 10 nm. Such a cross-section is well below the wavelength of a laser used, and can be achieved by applying a suited focusing device, such as a nano-antenna device, capable of focusing optical energy to a small area having, e.g., a cross-section of 10-500 nm. Also a pin hole may be used, e.g., a pin hole having a size of 20-500 nm, such as 50-250 nm, e.g., 100 nm; however, such a pin hole consumes energy. Therewith the present method is superior in terms of density compared to prior art methods.

Thus magnetization of relatively small areas can be established by the present method. Typically such is at present more limited by materials used than by the method, e.g., in that materials preferably should provide small domains, which domains are stable in time.

In an example of the present method the second magnetization reversal time domain is at least 10% larger than the first magnetization reversal time domain, preferably at least 50% larger, and wherein the second magnetization reversal time domain is at most 100 times larger than the first magnetization reversal time domain, preferably at most 10 times larger, and wherein the second magnetization reversal time domain is preferably smaller than 100 ps, preferably smaller than 10 ps.

It is preferred that the first and second magnetization reversal time domains are substantially distinct in size, in order to allow the present system to move to a far from equilibrium state in the first step a) of the present method, and then allow the system to reverse the magnetization in step b). Thereto it is preferred that the second time domain is at least 10% larger. Further, it is also preferred that the second magnetization reversal time domain is not too large, in order to provide ultra-fast switching times. As a consequence it is preferred that the second time domain is at most 100 times larger than the first domain and that it is preferably smaller than 100 ps.

In an example of the present method the stimulus increases the temperature of an electron system having a Curie temperature, preferably to a temperature higher than the Curie temperature, such as 100° C. higher than the Curie temperature, such as more than 200° C. higher, and/or wherein the magnetic material remains substantially at ambient temperature.

As an advantage the present method provides a system which remains substantially at ambient temperature, apart from the electrons, which for a very short time are heated. By applying a very short stimulus with enough energy, but typically not too much energy, such is achieved.

The present invention relates in a second aspect to a high density time stable ferrimagnetic, anti-ferromagnetic, or artificial ferrimagnetic, or a combination thereof, multi-component system, suitable for heat induced magnetization reversal, according to claim 9. Where the term "ferromagnetic" is used in the description of present materials and methods, it may be replaced by "anti-ferromagnetic" or "artificial ferromagnetic", and vice versa, in particular when relating to functional characteristics thereof.

Therein magnetic components may be regarded to form a sub lattice, such as in an alloy, in a multilayer, in an embedded structure, etc.

As an advantage an electron system of the present material can be heated separately to a temperature higher than a Curie temperature thereof and the system as a whole remains virtually constant in temperature.

Further the present system is extremely stable in time and can withstand high external magnetic fields, such as in the order of a Tesla.

Typically at least one ferromagnetic material i from a first sub-lattice is substantially different from at least one ferromagnetic material j from a second sub-lattice.

Typically, e.g., an exchange integral Jij between spins of lattice sites i and j give rise to a magnetic order in the material, such that a first sub-lattice is magnetically aligned anti-parallel with a second sub-lattice.

In an example the present invention relates to a ferrimagnetic material wherein:
  i) at least two magnetic components (A,B) are coupled anti-ferromagnetically,
  ii) a first component (A) is characterized by a first relaxation time τ1, and
  iii) a second component (B) is characterized by a second relaxation time τ2,
wherein τ1>1.1*τ2, and preferably wherein τ1<2*τ2, more preferably τ1<10*τ2,
  iv) wherein τ1<30 ps, preferably wherein τ1<1 ps. Preferably τ1>2*τ2, such as τ1>3*τ2. Preferably τ1<5*τ2. Preferably τ1<20 ps, more preferably τ1<10 ps, even more τ1<5 ps, such as τ1<2 ps. In other words, relaxation times are preferably not too large (ps time domain), in order to allow ultrafast switching, and are preferably not too far apart, in order to allow a secure and reliable switching.

It is noted that as τ~μ/α according to the present model, wherein τ is the relaxation time for a given component, μ the magnetic moment thereof, and α the damping factor, the value of τ can be increased by increasing μ and/or decreasing α, and vice versa. As such one can adopt present materials to fulfill requirements given in the claims.

It is noted that components A and B can be interchanged.

Typically the term "component" relates to a material, comprising one or more (chemical) elements.

Details on how various parameters, such as τ, can be determined experimentally and/or through a model are given in the description below.

It has been found experimentally that when ferrimagnetic materials fulfill the above requirements they are typically suited for the present method.

It is believed that presence of a relatively slow layer moment (in combination with a fast layer moment) drives an FM-like state; it therefore has to be relatively large enough to aid the switching. A much larger τ1 ($\sim\mu_{slow}/\alpha_{slow}$) means there is a significant moment when the fast layer has small |μ|. It is also noted that switching has to some extent a magical character; it is considered not straightforward to combine components, only careful, very sophisticated and elaborate experimentation may lead to results according to the present invention.

In case of a synthetic ferromagnetic system τ1 may be as small as <100*τ2, or even <1000*τ2. In case of an alloy τ1 may be as small as <2*τ2, typically <1.2*τ2.

In case of oxides τ1 may be up to 30 ps, whereas τ2 is relatively small, such as <1 ps, or even 0.1 ps.

It has been found that a linear reversal is an important requirement for heat induced switching; the fast layer demagnetizes (reverses) quickly.

It has been found that many prior art materials have a too low anisotropy, such as FeGd, and are therefore less suited for magnetization reversal by a heat stimulus.

The component A is preferably selected from Fe, FeCo, Co, Ni, NiFe, NiCo, and combinations thereof. The component B is preferably selected from FePt, FePd, CoPt, CoPd, NiPt, NiPd, $Nd_2Fe_{14}B$, $SmCo_5$, TbPd, TbPt, GdPd, GdPt, and combinations thereof. The component C is preferably selected from Cu, Cr, Au, Ag, Ru, Ti, V, MgO, SiN, and combinations thereof. The component C may function as a spacing layer, in between e.g. a fast (type B) layer and a slow (type A) layer. Component C may also function as an interfacial layer, e.g. on top or below a layer, such as an A layer, therewith improving anisotropy.

It has been found that certain materials, such MgO and SiN, can enhance the anisotropy in soft materials which otherwise may have suitable characteristics but a too low anisotropy. In fact, it has been found that the addition of SiN or MgO seed layers may satisfy a high anisotropy requirement. An example is a combination with GdFeCo and TbFeCo.

It has been found that the exchange coupling drives the present switching process and needs to be large enough for a slow layer to switch in a reasonable time.

In case of a synthetic ferrimagnetic system a relative high anisotropy is preferred in the fast layer, which has been found to ensure that after the fast layer switches along the initial direction of the slow layer, it does not switch back. Therein a relatively low anisotropy is preferred in the slow layer, which has been found to force the slow layer antiparallel to the fast layer.

It is noted that the present multi component system may consists of more than one stack of layers, as is, e.g., indicated below. Typically 2-10 stacks may be formed, wherein layers have a thickness such as 2-20 nm, such as 5-10 nm.

In an example of the present ferrimagnetic material the material (a) is an alloy comprising magnetic components (A,B), or (b) is a multilayer, the multilayer having one or more subsets (S) of layers, and optionally one or more intermediate coupling layers (Icl) comprising component C substantially adjacent to a subset (S), such as adjacent to every subset (S), each subset having:
  (S)(i) at least a first magnetic layer (A),
  (s)(ii) at least a second magnetic layer (B), and
  (s)(iii) optionally an intermediate coupling layer (C) substantially in between layers (A) and (B), or (c) is a 3-dimensional embedded structure, the structure having one or more substructures (Es), and optionally one or more intermediate coupling substructures (Ics) comprising component C substantially adjacent to a substructure (Es), such as adjacent to every substructure (Es), each substructure having (Es)(i) at least a first magnetic substructure (A), (Es)(ii) at least a second magnetic substructure (B), and (Es)(III) optionally an intermediate coupling substructure (C) substantially in between substructures (A) and (B), or (d) a combination thereof.

The above are various examples of present structures, further detailed in the figures.

Some examples of the above are: a bilayer comprised of magnetic component A and magnetic component B; a trilayer comprised of magnetic component A and magnetic component B, separated by a non-magnetic component C leading to antiferromagnetic coupling of the two magnetic components A and B; a multilayer comprised of multiple alternating layers of magnetic component A and magnetic component B; a multilayer comprised of multiple alternating layers of magnetic component A and magnetic component B, separated by a non-magnetic component C leading to antiferromagnetic coupling of the two magnetic components A and B; a nanostructure comprised of magnetic component A embedded in magnetic component B or vice versa; and a nanostructure comprised of magnetic component A embedded in a non-magnetic component C embedded in the magnetic component B, where the exchange coupling between magnetic components A and B is antiferromagnetic.

In an example the present invention relates to a ferrimagnetic material wherein both an exchange coupling JA-A between atoms of first component A and an exchange coupling JB-B between atoms of second component B are substantially larger than an exchange coupling JA-B between atoms of first component A and of second component B, wherein the exchange couplings are taken as absolute values. The factor preferably is at least a factor of 1.5, more preferably at least a factor of 2. It has been found experimentally that when ferromagnetic materials fulfill the above requirements they are typically suited for the present method.

In an example the present invention relates to a ferrimagnetic material wherein components A and B have substantially similar magnetic moments. Such offers the option to tune the present system, e.g., in view of requirements thereof, components being available, costs, etc.

In an example the present invention relates to a ferrimagnetic material wherein component A and/or component B comprise(s) at least one magnetic material selected from Group 3-12, Period 4-6 elements, such as Fe, Co, Ni, and combinations thereof comprising such a magnetic material, such as FePd, FeCo and FePt, and/or wherein component A and/or component B comprise(s) a material selected from lanthanides, scandium, yttrium, and combinations thereof, such as from Sc, Y, Sm, Gd, Dy, Ho, Er, Yb, Tb, such as Tb and Gd, and combinations thereof, and/or wherein an optional intermediate coupling component C comprises a material selected from Cu, Cr, Au, Ru, Ti, V, and combinations thereof, preferably a non-corroding, non-degrading, uniform, with component A and B immiscible component, preferably wherein based on atom % wherein the atom % is based on the total ferromagnetic material, component A comprises 5-95 atom %, preferably from 10-75 atom %, more preferably from 20-60 atom %, such as from 30-50 atom %, component B comprises 5-95 atom %, preferably from 10-75 atom %, more preferably from 20-60 atom %, such as from 30-50 atom %, and component C comprises 0-90 atom %, preferably from 1-50 atom %, more preferably from 2-30 atom %, such as from 3-10 atom %.

An example of such a material used, e.g., in experiments is for instance $Re_y Tm_{x1} Tm_{x2}$ wherein y is 16-35, preferably 20-24, x1 is 50-90 and x2 is 5-15. Some examples of suited materials are $Gd_y Fe_{x1} Co_{x2}$, such as $Fe_{66.5} Gd_{24} Co_{9.8}$. Further examples are $Tm_{x1} Tm_{x2}$ wherein x1 is 50-90, preferably 75-90 and x2 is 10-50, such as FePt, $Fe^3Pt$, FePd, $Fe^3Pd$, and FeCo.

It is noted that if a component according to the invention is present it is typically present above an impurity level, e.g., above 0.1 atom %, preferably above 1%. Typically an atom ratio A:B is therefore from $10^{-3}$-$10^3$, preferably from $10^{-2}$-$10^2$, more preferably from $2*10^{-2}$-$5*10^1$, even more preferably from 0.25-3, such as $3*10^{-2}$, $5*10^{-2}$, $7*10^{-2}$, $1*10^{-1}$, $1.5*10^{-1}$, 0.2, 0.25, 0.4, 1, 2, 2.5, 3, 4, 7, 10, 12.5, 20, and 30. In certain cases the ratio A:B is preferably smaller than about 2.

In an example the present invention relates to a ferrimagnetic material wherein the multilayer comprises a layer of a first component A having a thickness of 0.5-20 nm thickness, preferably 3 nm, an intermediate layer C having a thickness of one monolayer –5 nm thickness, preferably 1 nm, and a layer of a second component B having a thickness of 0.5-20 nm thickness, preferably 6 nm, preferably wherein the thickness of layer A<2*the thickness of layer B.

As such very thin materials can be obtained, yet having a high magnetic density and excellent stability.

In an example the present invention relates to a ferrimagnetic material wherein the first component A and/or second component B comprise(s) substantially a single transition metal or a combination of elements resembling such a single transition metal, and wherein first component A and/or second component B comprise(s) substantially a rare earth element or a combination of elements resembling such a single rare earth metal.

It is noted that the present material allows for very flexible choice of components.

In an example the present material relates to a two sublattice system which can be represented by a single generic transition metal (TM) and a rare earth (RE) sublattice. Exchange constants and gyromagnetic ratio of the sublattices for a modeled Heisenberg (prior art) Gd—Fe magnet can be taken as $J_{Fe-Fe}=2.835\times 10^{-21}$ J/link, $J_{Gd-Gd}=1.26\times 10^{-21}$ J/link (corresponding to a Curie temperature of bulk Gd) and $J_{Fe-Gd}=-1.09\times 10^{-21}$ J/link. Taking into account the number and type of neighbors, the effective Fe—Fe exchange is taken as $1.96\times 10^{-20}$ J per spin (35 fs), the Gd—Gd effective exchange is taken as $8.72\times 10^{-22}$ J per spin (760 fs) and the Fe—Gd effective exchange is taken as $-4.77\times 10^{-21}$ J per spin (140 fs). The gyromagnetic ratios of Gd and Fe sublattices were taken as $\gamma TM=1.05\gamma$ and $\gamma RE=1\gamma$, with $\gamma=1.76\times 10^{11} T-1s-1$. It is noted GdFe does not have a suited coercivity (or suited anisotropy).

It is noted that details on present parameters can be found in various articles, e.g., I. Radu et al, Nature 472, 205 (2011); A. Kirilyuk et al, Rev. Mod. Phys. 2010, and B. Koopmans et al, Nature Materials 9, 259 (2010).

FIG. 1 shows model behavior of magnetization of each of the two magnetic sublattices after applying an ultra-short heat pulse only, with a maximum electron temperature of 1219° C. (1492° K). The figure clearly shows that such a heat pulse does stimulate magnetization reversal in the material. Moreover, and extremely importantly, this reversal occurs in the absence of any external magnetic field or any other stimulus. The experiments also show that heat-induced magnetization reversal is observed with starting temperatures below and above the magnetization compensation point.

It is important to have sublattices that are non-equivalent and have distinct timescales, as can be shown by, e.g., simulations showing switching without a field having the local magnetic moments equal. Results of these simulations are shown on FIG. 2. Because of the fact that moments are the same (in-fact the correlator is the same), the two sublattices reach their relative minima at the same time, which is dependent on the exchange interaction felt, which is not the same for each sublattice.

In an example the present invention relates to a ferrimagnetic material wherein the at least two sublattices have a substantially different demagnetization behavior.

In an example the present invention relates to a ferrimagnetic material wherein the material is stable (does not flip) within a relative short period of time, such as 1 ps up, in an external magnetic field of at least 1 Tesla, preferably at least 5 Tesla, more preferably at least 10 Tesla, such as 40 Tesla. It is noted that the material is kept at a substantially constant temperature in the magnetic field. Such is an indication that the material is very suited for long term storage under various conditions, e.g., those typically encountered.

As a consequence only a high magnetic field is capable of magnetization reversal of the present system. The system is therefore very stable. It is noted that the present system is also very stable at (slightly) increased temperature, e.g. up to 70° C.

In an example the present invention relates to a ferrimagnetic material wherein an effective first exchange between a first atom and second atom of the first lattice is larger than $1*10^{-20}$ J/spin, such as larger than $1.5*10^{-20}$ J/spin, wherein an effective second exchange between a first atom and second atom of the second lattice is less than $2.5*10^{-21}$ J/spin, such as less than $1.1*10^{-21}$ J/spin, wherein an effective third exchange between an atom of the first lattice and an atom of the second lattice is smaller than the effective first exchange and larger than the effective second exchange, albeit with a negative value.

It has been found experimentally that when ferromagnetic materials fulfill the above requirements they are typically suited for the present method.

The present invention relates in a third aspect to a ferrimagnetic domain comprising the present ferrimagnetic material.

The present invention relates in a fourth aspect to an product comprising the present ferrimagnetic material, such as a storage device, a modulator, a chip, a semiconductor device, a sensor, a write head, a MRAM, a ROM, an oscillator, a MEMS, a logic device, a bi-stable switchable logic device, and combinations thereof. As such the present invention is applicable in many fields of technology, e.g., semiconductor technology, nanotechnology, microtechnology, which technologies and products thereof are applicable in many further fields of technology.

The present invention relates in a fifth aspect to a system for magnetization reversal, comprising a) a ferrimagnetic material according to the invention, b) a stimulator, such as a source for a heat pulse and/or a source for light, such as non-polarized light. It is noted that the source of light may be polarized, non-polarized, linear polarized, circular polarized, elliptical polarized and a combination thereof.

The present invention relates in a sixth aspect to a use of a ferrimagnetic material according to the invention and/or method according to the invention for storing information, for switching, for oscillating, for digital processing, for analogue processing, and combinations thereof. Of course the present material is also particularly well suited for obtaining high magnetic fields.

EXAMPLES

The invention is further detailed by the accompanying figures and examples, which are exemplary and explanatory of nature and are not limiting the scope of the invention. To the person skilled in the art it may be clear that many variants, being obvious or not, may be conceivable falling within the scope of protection, defined by the present claims.

(1) Synthetic Ferrimagnets

In the below examples of synthetic materials the present system consists of a slow layer, a spacing layer (to engineer the AFM coupling), and a fast layer materials in the form "slow/spacing/fast" or optionally "slow/spacing/fast/enhanced_anisotropy layer". Material parameters relevant for the demagnetization for each sample are listed below in the form "slow,fast".

Specific Examples of Suitable Structures

1a) FeCo/Ru/FePt

α: 0.001, 0.1; μ: 2.3, 1.6; Exchange J: $1\times10^{\wedge}-2$ J/m$^2$
Anisotropy: $1.0*104$ J/m$^3$, $1.0*10^7$ J/m$^3$

| slow/fast | Fe | FeCo | Co | NiFe |
|---|---|---|---|---|
| FePt | x | X | x | x |
| FePd | x | X | x | x |
| CoPt | x | X | x | x |
| Nd2Fe14B | x | X | x | x |
| SmCo5 | x | X | x | x |

1b) FeCo/Ru/Ni/MgO

α: 0.01, 0.01; μ: 2.3, 0.6; Exchange J: $1\times10^{-2}$ J/m$^2$
Anisotropy: $1.0*104$ J/m$^3$, $1.0*106$ J/m3 (effective)

| slow/fast | Fe | FeCo | Co | NiFe |
|---|---|---|---|---|
| Ni | x | x | x | x |
| FePd | x | x | x | x |
| CoPt | x | x | x | x |
| Nd2Fe14B | x | x | x | x |
| SmCo5 | x | X | x | x |

Anisotropy enhancer alternative: SiN, Ru, Cr, Au, Ti, Ag, V, Cu.

(2) Transition Metal Alloys

In the present TM alloys intrinsic antiferromagnetic coupling is used between neighbouring moments to enable switching. An (MgO) interfacial anisotropy layer may be provided to enhance the thermal stability of the materials.

2a) Fe/Mn|MgO

α: 0.01, 0.01; μ: 2.2, 0.6; Exchange: 0.1 J/m$^2$
Anisotropy: 1.0*10$^6$ J/m$^3$ (effective)

|      | fast |      |    |      |      |      |      |      |      |      |
|------|------|------|----|------|------|------|------|------|------|------|
| slow | Fe   | FeCo | Co | NiFe | FePt | CoPt | NiCo | CoPd | NiPt | NiPd |
| Mn   | x    | X    | x  | x    | x    | x    | x    | x    | x    | x    |

Anisotropy enhancer alternative: SiN, Ru, Cr, Au, Ti, Ag, V, Cu.

2b) Fe/Cr|MgO

α: 0.01, 0.01; μ: 2.2, 0.5; Exchange: 0.1 J/m$^2$; Anisotropy: 1.0*106 J/m$^3$ (effective).

|      | fast |      |    |      |      |      |      |      |      |      |
|------|------|------|----|------|------|------|------|------|------|------|
| slow | Fe   | FeCo | Co | NiFe | FePt | CoPt | NiCo | CoPd | NiPt | NiPd |
| Cr   | x    | X    | x  | x    | x    | x    | x    | x    | x    | x    |

Anisotropy enhancer alternative: SiN, Ru, Cr, Au, Ti, Ag, V, Cu.

(3) Heusler Alloys and Oxides

In the present Heusler alloys an intrinsic antiferromagnetic coupling between neighboring moments is present to enable switching, but also an optional (MgO) interfacial anisotropy layer may be present to enhance the thermal stability of the materials.

3a) CoFe$_2$O$_4$|MgO (Cobalt Ferrite)

α: 0.001; μ: 2.2 (Fe), 1.4 (Co); Exchange: 0.1 J/m$^2$
Anisotropy: 1.0*10$^6$ J/m$^3$ (effective)
Co material alternatives: Ni, Mn, Cr
Anisotropy enhancer alternative: SiN, Ru, Cr, Au, Ti, Ag, V, Cu.

3b) Co$_2$MnSi|MgO (Heusler alloy)

α: 0.01; Moment: 1.6 (Co), 0.7 (Mn); Exchange: 0.1 J/m$^2$; Anisotropy: 1.0*10$^6$ J/m$^3$ (effective).
Alternatives: Ni$_2$MnAl, Ni$_2$MnIn, Ni$_2$MnSn, Ni$_2$MnSb, Ni$_2$MnGa, Co$_2$MnAl, Co$_2$MnSi, Co$_2$MnGa, Co$_2$MnGe, Co$_2$FeSi, Co$_2$FeGe Turning to the figures, FIG. 1 shows time-resolved dynamics of the z-component of the Fe and Gd sublattice from localized atomistic spin model. In the top panel the y-axis is the (absolute) temperature in ° K, the arrow indicates a temperature of 1219° C. (1492° K), both panels have the same x-axis indicating ps, in the lower panel the relative magnetization is shown, top line of Fe, and bottom line of Gd. The external magnetic field H is 0. Schematically the magnetic moment of Fe and Gd is shown. The upper panel shows temporal evolution of the temperature of the heat-bath after the latter is excited by an ultra-short heat pulse. The lower panel shows evolution of the laser-induced magnetic changes. The system starts at low temperature in the anti-parallel ground state and a laser pulse is applied, increasing the temperature of the system. The system is then driven into a non-equilibrium state whereby the sublattices align against the exchange interaction. Switching then occurs bringing the sublattices back into alignment. Moreover, and extremely importantly, this reversal occurs in the absence of any external magnetic field or any other stimulus.

Figure 2A:
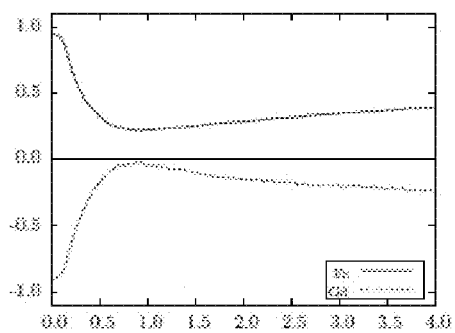
FIGS. 2a-b show numeric simulations of demagnetization.
Figure 2B:
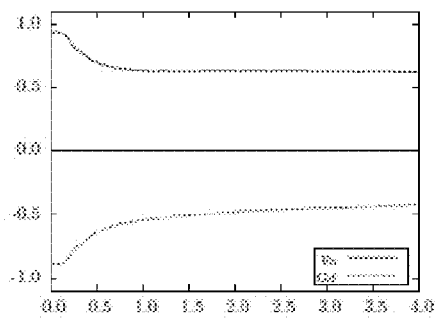

FIGS. 2a-c show numeric simulations of demagnetization. The x-axis relates to ps, whereas the y-axis shows relative magnetization for Fe (solid top line) and Gd (dotted lower line). For FIG. 2a μTM=μRE=1.92, for FIG. 2b μTM=μRE=7.63. To show the importance of having sublattices that are non-equivalent and have distinct timescales, inventors performed simulations showing switching without a field having the local magnetic moments equal. Both instances of the equivalent moments were tested having, in the first instance, the moments equal to the experimental FeCo moment and secondly equal to the Gd moment. The results of these simulations are shown on FIG. 2. Because of the fact that the moments are the same (in-fact the correlator is the same), the two sublattices reach their relative minima at the same time, which is dependent on the exchange interaction felt, which is not the same for each sublattice.

FIG. 2c relates to a more industrially relevant case of FePt. FePt is a material that, in the L10 phase, has a very high magneto-crystalline anisotropy. FePt is additionally interesting in that Pt is not normally magnetic, but in close proximity to Fe has been found to develop an induced magnetic moment entirely dependent on the exchange field from the Fe. The induced moment is relatively small (0.3 μB) and also delocalized and so it is at present expected that the demagnetization of Pt follows that of the Fe moments. Another aspect of demagnetization rates in FePt is the observed high value of the intrinsic damping constant (λ~0.1) associated with strong spin-orbit interaction from the Pt moments. To compare the demagnetization rates of FePt with pure Fe, the inventors have simulated the two materials using the same atomistic spin model described earlier, with exchange constants derived from experimentally known values of the Curie temperature (817° C. (1090° K) for Fe and 527° C. (700° K) for FePt). Atomic magnetic moments were also derived from experimental values, 2.5 μB and 1.6 μB for Fe and FePt respectively. An ultrafast heat pulse is simulated using a two temperature model with a pulse width of 20 fs and an instantaneous peak electron temperature of 1223° C. (1500° K), sufficient to cause complete demagnetization of the FePt layer. The time evolution of the system is computed with a Landau-Lifshitz-Gilbert equation with Langevin dynamics, integrated using the Heun numerical scheme. While the differences in the moments are not large, the different intrinsic damping in the two materials λ=0.05 in the Fe layer and λ=0.1 in the FePt layer leads to substantially different demagnetization times (See FIG. 2c).

For (prior art) ferrimagnetic GdFe, the differential demagnetization for the two sublattices, in combination with their anti-ferromagnetic exchange coupling, leads to an additional unexpected feature of purely laser induced magnetization reversal without the application of an external magnetic field. Here, this reversal appears to be a multistep process, in which the first step is driven by the ultrafast heating of the electrons in the metallic alloy, whereas the subsequent switching is driven by a strong exchange coupling between the antiferromagnetically coupled sublattices. One possible approach is to embed such nano-patterned transition metal structure in a rare-earth matrix like Gd, to profit from the strong and anti-ferromagnetic exchange coupling between them. An even more practically attractive structure may be obtained by replacing the rare earth Gd by Fe, creating a synthetic ferrimagnetic structure by exchange coupling a FePt layer via a spacer layer with an Fe layer. A key ingredient for switching in a synthetic ferrimagnet is the anti-ferromagnetic coupling between the two ferromagnetic layers. For this simulation we assumed a reasonably strong coupling of 1.09×10-21 J/link. The composite system consists of a 5 nm diameter cylinder, with a 5 nm thick FePt layer, and 1 nm thick Fe layer. The non-magnetic metallic spacer is not simulated directly, but simply assumed to lead to an effective antiferromagnetic coupling between the two ferromagnets. Under the action of a heat pulse, the two layers exhibit complicated magnetization dynamics. Unlike previous experimental results with intrinsic ferrimagnets, the reversal in the synthetic system is considered a combination of linear and precessional reversal mechanisms for the FePt and Fe layers, respectively. The FePt layer follows a linear reversal path through rapid demagnetization and subsequent recovery of the magnetization in the opposite direction, while the precessional reversal of the Fe layer is driven by the interlayer exchange interaction, and occurs on the timescale of 8 ps. The prediction of reversal for such composite structure is particularly significant as it allows the dynamics and magnetic properties of individual layers to be engineered using common transition metal alloys, rather than requiring rare-earths such as Gd or Tb. With regard to potential devices, this also opens up the possibility of nano-patterned devices with magnetic elements in the sub 10 nm range.

The present invention demonstrates a possibility to tune the dynamics of multisublattice ferromagnets and ferrimagnets by their composition and exchange interaction. This leads to distinctly different and faster demagnetization times even for the same element. In ferrimagnetic structures, such different dynamics may lead to purely heat driven switching. This allows designing new magnetic materials that combine desirable properties for future recording media. In particular, the laser induced picoseconds switching of the synthetic ferrimagnetic structure FePt/Fe offers the possibility to combine the high anisotropy and consequently high density capacity of FePt with the presently discovered high speed reversal of ferrimagnetic materials, leading to THz recording rates at Tb/cm$^2$ densities.

Figure 3:
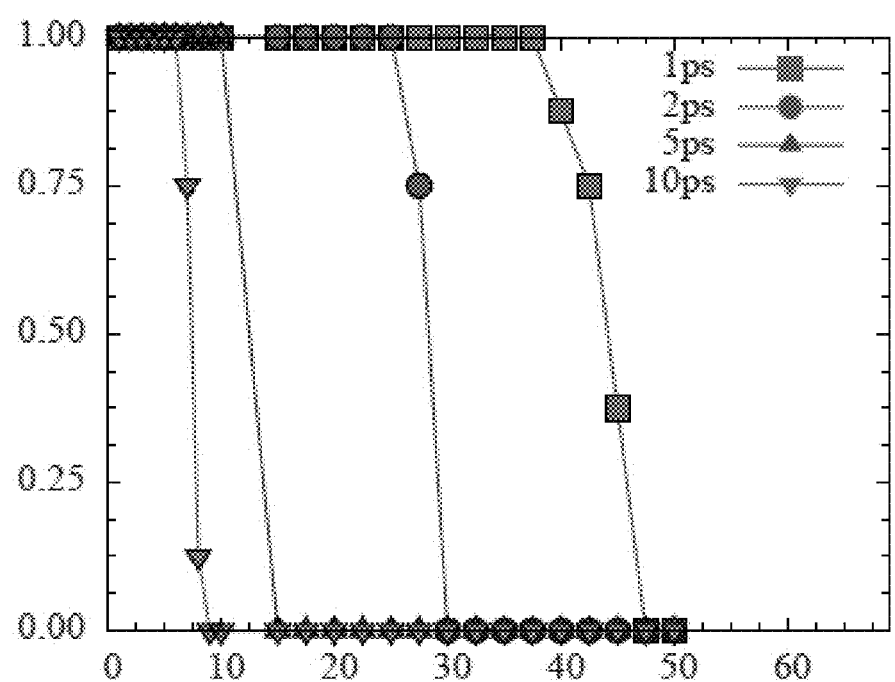
FIG. 3 shows a field required to prevent reversal with the measurement taken at different times.

FIG. 3 shows a field required to prevent reversal with the measurement taken at different times. Therein the x-axis shows applied magnetic field B in T, the y-axis relative magnetization, for four cases (right to left: 1 ps, 2 ps, 5 ps and 10 ps of magnetic field).

A field is applied to the present ferrimagnetic material to prevent reversal. Therein B is an applied (magnetic) field. The field strength required to prevent reversal is dependent on when the system is reversed as the system will start to precess back to align with the field, being equal to the intrinsic coercivity of the system for long times. As we can see from FIG. 3 a field of around 40 Tesla is the required to prevent reversal the Fe magnetization reversing into the Gd direction (i.e. the spin-flip state), which is an extremely high field when the measurement is taken at 1 ps. Depending on when the measurement is made the field required to prevent reversal changes. For longer times a lower field is required because precessional switching begins to occur for long times, and in theory for time of the order of nanoseconds the field required to prevent reversal will be equal to the intrinsic anisotropy field at the final temperature of the experiment.

FIG. 3 shows the probability of reversal (vertical axis) when applying a field Bz (horizontal axis in [T]) required to prevent reversal when the magnetization is taken at 1, 2, 5 and 10 picoseconds.

The experiments show the present ferrimagnetic material is extremely stable.

FIGS. 4a-d show the magneto-optical images of $Gd_{24}Fe_{66.5}Co_{9.8}$ continuous film obtained after the action of a sequence of the N right-handed σ+ and left-handed σ− circularly-polarized 100 fs laser pulses.

FIG. 4(a) shows the film after an excitation with one single circularly polarized pulse with the fluence 0.185 mJ/cm$^2$.

FIG. 4(b) shows the film after an excitation with N (N=2, 3 . . . 10) circularly polarized pulse with the fluence 0.195 mJ/cm$^2$.

FIG. 4(c) shows the film after an excitation with one single circularly polarized pulse with the fluence 0.190 mJ/cm$^2$.

FIG. 4(d) shows the film after an excitation with N (N=2, 3 . . . 10) circularly polarized pulse with the fluence 0.190 mJ/cm$^2$.

FIG. 4 shows the result of an action of single right- and left-handed circularly polarized pulses on the continuous film of $Gd_{24}Fe_{66.5}Co_{9.8}$ alloy, which initially was in a single domain state with magnetization perpendicular to the sample surface. White areas correspond to domains magnetized "up", while black domains correspond to the areas magnetized "down". After excitation of a white domain with the very first right-handed circularly polarized pulse σ+ one can see a formation of a black domain. The second pulse of the same helicity again reverses the magnetization of the excited area forming a white domain. The third pulse again triggers the switching resulting in a pattern similar to the one observed after the very first excitation. Repeating the experiments for the opposite helicity of the laser pulses σ− gives very similar results. The experimental observations are in a very good agreement with the heat-driven switching predicted by the atomistic simulations, where every pulsed excitation should trigger the magnetization reversal. It is remarkable, however, that a slight decrease of the pulse intensity changes the picture dramatically resulting in a helicity-dependent magnetization reversal, where the magnetization of the laser excited medium is fully defined by the helicity of the laser pulse. In particular, a right-handed circularly polarized pulse does reverse magnetization in a white domain and does not affect a black one. Therefore, these experimental results demonstrate that an excitation of a ferrimagnetic GdFeCo alloy with an intensity slightly higher than the one required for an all-optical switching with circularly polarized light always results in magnetization reversal. The switching does not require any external magnetic field and does not depend on the helicity of light or initial magnetization of the medium.

Figures 5A, 5B:
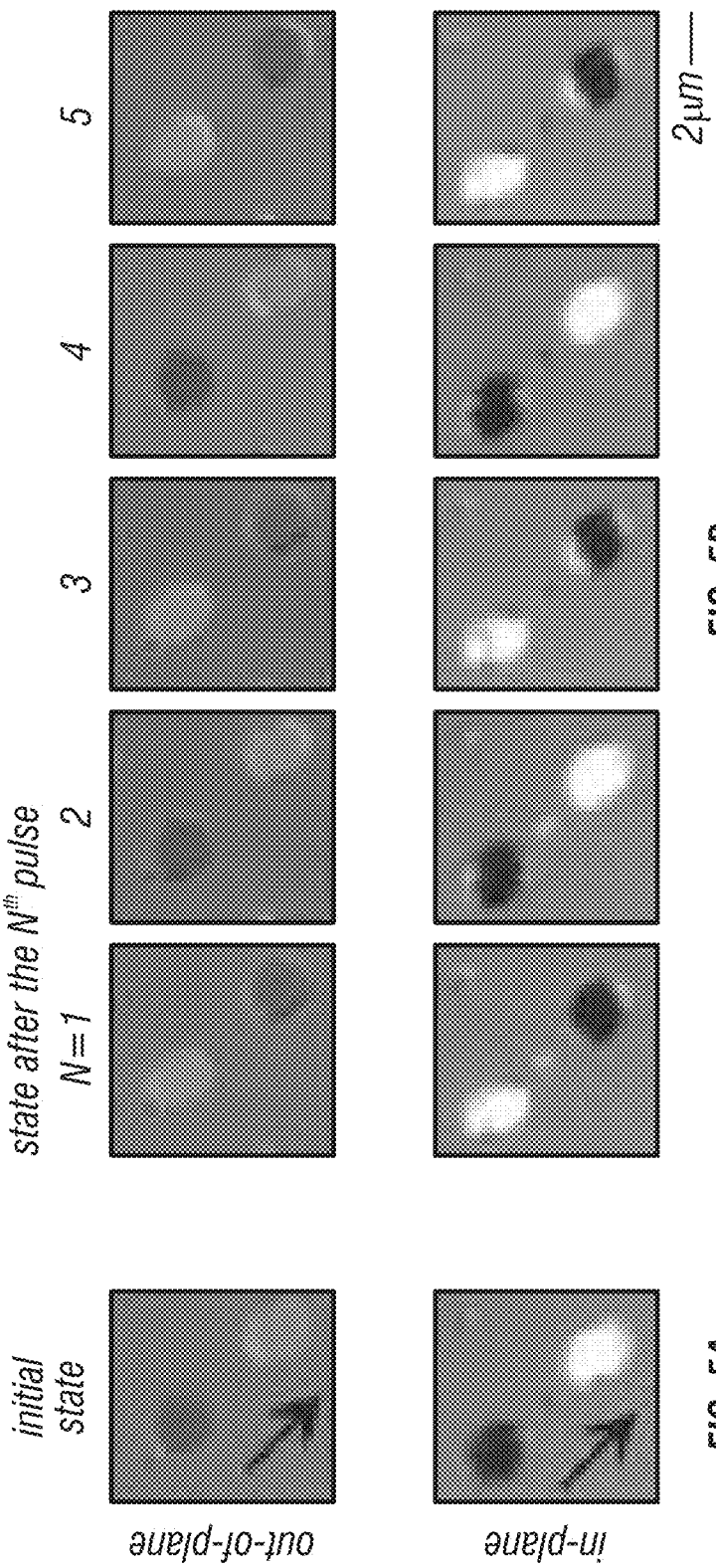
FIGS. 5a-b show XMCD images at Fe L3 edge of $Gd_{25}Fe_{65.6}Co_{9.4}$ microstructures with magnetization lying in out-of-plane and in-plane direction.

FIGS. 5a-b show XMCD images at Fe L3 edge of $Gd_{25}Fe_{65.6}Co_{9.4}$ microstructures with magnetization lying in out-of-plane and in-plane direction. The XMCD contrast is obtained after the initial state (a) and after every following laser pulse (b). The black arrows indicate the direction of the incoming x-rays. In contrast to the previous experiment where circularly polarized laser pulses at normal incidence were used, we used linearly p-polarized laser pulses at a 16° grazing incidence to avoid creation of any magnetic field via the Inverse Faraday effect. XMCD images recorded at the Fe L3 edge for four different structures with out-of-plane (top row) or in-plane (bottom row) magnetic anisotropies are shown in FIG. 5. These two different magnetic anisotropies were confirmed by an azimuthal dependent XMCD study which enables to determine a 3 dimensional map of the local magnetization. Measurements at the Gd edge reveal the antiparallel coupling between the Fe and Gd sublattices (not shown). The distance between the structures is as large as their diameter, thereby excluding dipole inter-action between them. For the out-of-plane structures, FIG. 5 (top row), the microstructures show dark grey and bright grey contrasts which correspond to magnetizations pointing in opposite directions, e.g., in and out of the sample plane. From the initial state (FIG. 5(a)), we applied a series of p-polarized laser pulses. After the first single pulse, the contrast is simultaneously reversed in both structures, meaning that the magnetization has switched in comparison to the initial state. The same observation is made after every subsequent single laser pulse. This demonstrates that the sub-picosecond heat generated by the p-polarized laser pulse is sufficient to induce a deterministic magnetization reversal within the microstructures. In the heat reversal model proposed, no dependence on the magnetic anisotropy direction of the sample is expected. We have thus investigated in-plane magnetized microstructures as well.

The XMCD images are shown in FIG. 5 (bottom row) and the bright and dark contrast corresponds to opposite in-plane magnetization directions. The contrast in both structures reverses after every laser pulse, meaning that the magnetization switches every time the microstructures are excited with a single p-polarized laser pulse, similar to the out-of-plane microstructures. This experiment thus demonstrates that the ultrafast heat pulse created by linearly polarized laser pulse induces a deterministic switching of the magnetization, without the need for any other external stimulus.

Figure 6A:
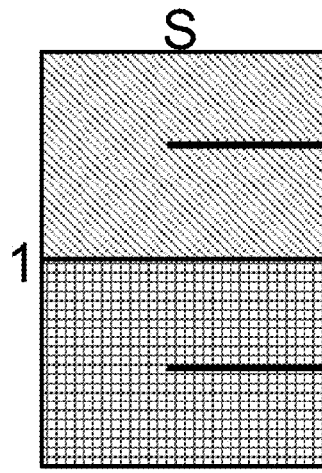
FIGS. 6a-d show schematic cross-sections of multilayer ferrimagnets.
Figure 6B:
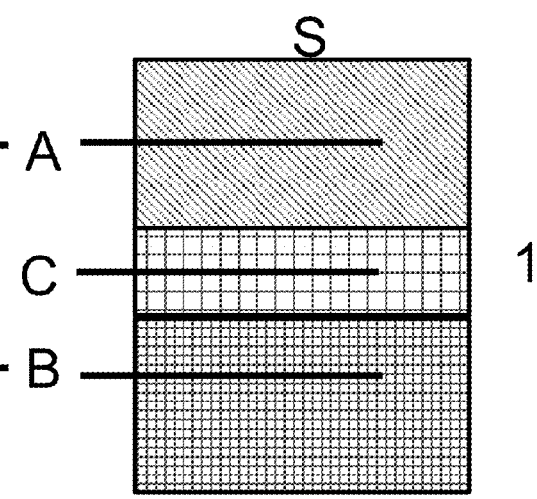
Figure 6C:
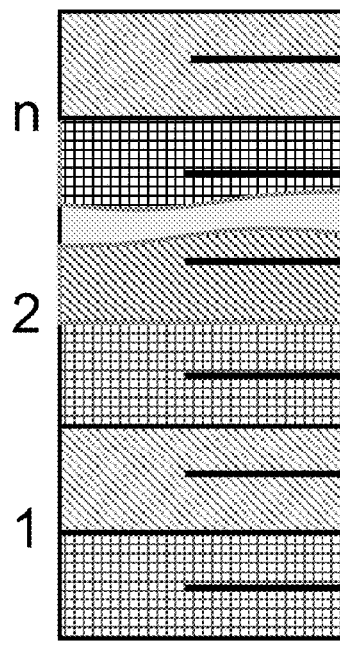
Figure 6D:
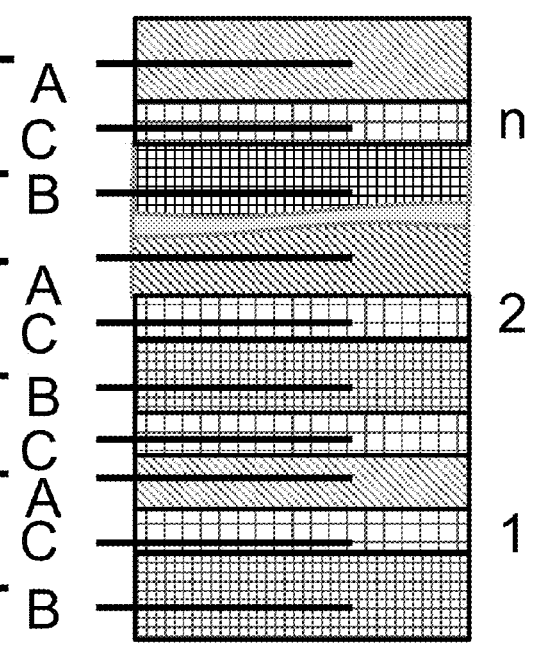

FIGS. 6a-d show schematic cross-sections of multilayer ferrimagnets. In FIG. 6a a two-layer structure forming a subset S is shown, having a first layer of component B and a second layer of component A, whereas in FIG. 6b also an intermediate layer C is present. A, B and C have the same meaning as above. In FIG. 6c n substructure S comprising A and B, stacked on top of each other, are shown, whereas in FIG. 6d n substructure S comprising A and B and C, stacked on top of each other, are shown. It is noted that optionally a layer C may be present between two subsets, such as is shown between subset 1 and 2. The thickness of the layers is as indicated above.

FIGS. 7a-e show schematic cross-sections of embedded ferrimagnets. In FIG. 7a a top view of an embedded ferrimagnet substructure Es is shown, having a substantially rectangular or square shape. The outer 3D-structure B encloses an inner 3D-structure A. A, and B have the same meaning as above. In FIG. 7b a similar structure is shown as in FIG. 7a, however now substantially cylindrical. The shape may also be multigonal, such as in FIG. 7c. Two arrows (left and right) indicate where the cross-section of FIGS. 7a-c is taken, which cross-section is shown in FIG. 7d. FIG. 7e shows an example of a 2D-layout of elements of FIG. 7c.

FIGS. 8a-e show schematic cross-sections of embedded ferrimagnets. In FIG. 8a a top view of an embedded ferrimagnet substructure Es is shown, having a substantially rectangular or square shape. The outer 3D-structure B encloses an intermediate 3D-structure C substantially, whereas the intermediate 3D-structure C encloses an inner 3D-structure A. A, B and C have the same meaning as above. In FIG. 8b a similar structure is shown as in FIG. 8a, however now substantially cylindrical. The shape may also be multigonal, such as in FIG. 8c. Two arrows (left and right) indicate where the cross-section of FIGS. 8a-c is taken, which cross-section is shown in FIG. 8d. FIG. 8e shows an example of a 2D-layout of elements of FIG. 8c.

Typical wall thickness of 3D-structure B and C in FIGS. 7-8 are from 1-20 nm, whereas 3D-structure is from 2-100 nm. Typical heights of the structures are from 1 nm-500 nm, such as from 2-100 nm. In view of material used the structures are as small as possible; however in view of magnetic stability the structures are relatively large. The above ranges are found to be optimal in this respect.

The optionally one or more intermediate coupling substructures (Ics) comprising component C substantially adjacent to a substructure (Es), such as adjacent to every substructure (Es) are not shown, but are similar in a way to those of FIG. 6.

The invention although described in detailed explanatory context may be best understood in conjunction with the accompanying figures.

Although the invention has been described in detail with particular reference to these preferred embodiments, other embodiments can achieve the same results. Variations and modifications of the present invention will be obvious to those skilled in the art and it is intended to cover in the appended claims all such modifications and equivalents. The entire disclosures of all references, applications, patents, and publications cited above are hereby incorporated by reference.

What is claimed is:

1. A method of magnetization suitable for reversal in a multi component magnetic system in the absence of an externally applied magnetic field, the system comprising at least a first magnetic sub system and a second magnetic sub system, the first and second sub systems being coupled anti-ferromagnetically, the method comprising the steps of:
   a) applying a stimulus to the magnetic system thereby reversing at least one magnetic moment of the first sub system, wherein the stimulus is an ultrafast heat pulse of less than 100 ps and is applied during a period in a first magnetization reversal time domain, and
   b) relaxing and thereby reversing at least one magnetic moment of the second sub system, during a period in a second magnetization reversal time domain,
   wherein the first magnetization reversal time domain is at most 100 times smaller than the second magnetization reversal time domain.

2. The method according to claim 1, wherein the magnetic system comprises at least two non-equivalent sub systems.

3. The method according to claim 1, wherein the stimulus is applied during a period shorter than a time of thermal equilibrium.

4. The method according to claim 3, wherein the heat pulse is a laser pulse, wherein the wavelength of the laser pulse is from 100 nm-10000 nm.

5. The method according to claim 1, wherein an energy density of the stimulus is from 0.05-5 mJ/cm$^2$ and/or wherein magnetization reversal is established in an area of the magnetic system having a cross-section of less than 250 nm.

6. The method according to claim 1, wherein the second magnetization reversal time domain is at least 10% larger than the first magnetization reversal time domain and wherein the second magnetization reversal time domain is at most 10 times larger than the first magnetization reversal time domain, and wherein the second magnetization reversal time domain is smaller than 100 ps.

7. The method according to claim 1, wherein the stimulus increases the temperature of an electron system having a Curie temperature to a temperature higher than the Curie temperature and/or wherein the magnetic material remains substantially at ambient temperature.

\* \* \* \* \*